United States Patent
Fujii

(10) Patent No.: US 6,396,330 B1
(45) Date of Patent: May 28, 2002

(54) MIXER CIRCUIT

(75) Inventor: Masahiro Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/694,277

(22) Filed: Oct. 24, 2000

(30) Foreign Application Priority Data

Oct. 27, 1999 (JP) ............................................ 11-304791

(51) Int. Cl.[7] .................................................. G06G 7/12
(52) U.S. Cl. ....................................... 327/355; 327/359
(58) Field of Search ................................ 327/355–359; 330/252, 254, 260; 455/326, 333

(56) References Cited

U.S. PATENT DOCUMENTS

| | | | |
|---|---|---|---|
| 5,378,997 A | 1/1995 | Sawyer | 330/260 |
| 5,448,772 A | 9/1995 | Grandfield | 455/333 |
| 5,805,988 A | 9/1998 | Clayton et al. | 455/333 |
| 5,809,410 A | 9/1998 | Stuebing et al. | 455/333 |
| 5,896,063 A | 4/1999 | Marsh et al. | 327/359 |
| 5,942,929 A * | 8/1999 | Aparin | 327/233 |
| 6,205,325 B1 * | 3/2001 | Groe | 455/333 |
| 6,230,001 B1 | 5/2001 | Wyse | 455/326 |
| 6,255,889 B1 * | 7/2001 | Branson | 327/359 |

FOREIGN PATENT DOCUMENTS

| | | |
|---|---|---|
| JP | 57-71163 | 5/1982 |
| JP | 4-17405 | 1/1992 |
| JP | 7-46045 | 2/1995 |
| JP | 8-32353 | 2/1996 |
| JP | 10-126300 | 5/1998 |
| JP | 11-27170 | 1/1999 |

OTHER PUBLICATIONS

Gray & Meyer, "Technique for Designing an Analog Integrated Circuit for VLSI", pp. 170–173.

* cited by examiner

Primary Examiner—Toan Tran
Assistant Examiner—Long Nguyen
(74) Attorney, Agent, or Firm—Whitham, Curtis & Christofferson, P.C.

(57) ABSTRACT

A mixer circuit includes first to fourth input terminals, a first transistor having a base electrically connected to the first input terminal, a second transistor having a base electrically connected to the second input terminal, third and fourth transistors each having a base electrically connected to the third input terminal, fifth and sixth transistors each having a base electrically connected to the fourth input terminal, the first transistor having a collector electrically connected to emitters of the third and fifth transistors, the second transistor having a collector electrically connected to emitters of the fourth and sixth transistors, the third transistor having a collector electrically connected to a collector of the sixth transistor, the fourth transistor having a collector electrically connected to a collector of the fifth transistor, a first impedance element connected between the first input terminal and the second transistor, and a second impedance element connected between the second input terminal and the first transistor.

15 Claims, 12 Drawing Sheets ic*n MIXER CIRCUIT

BACKGROUND OF THE INVENTION

1. Field of the Invention

The invention relates to a mixer circuit, and more particularly to a gilbert cell type double-balanced mixer circuit with small distortion.

2. Description of the Related Art

A radio-signal transceiver such as a presently remarkably spreading cellular phone has a radio-frequency signal receiver operating under a super heterodyne system wherein as a received radio-frequency (RF) signal is converted to an intermediate frequency (IF) signal having a smaller frequency, the received signal is amplified up to a desired signal level. A circuit converting a frequency of a radio-frequency signal in a radio-signal transceiver is called a down converter, and a circuit accomplishing a main function of a down converter is a mixer circuit.

A down converter dealing with a frequency in the rage of 800 MHz to 2 GHz, such as a frequency of a radio-signal in a cellular phone, is generally designed to include a double-balanced mixer circuit having a gilbert cell. Herein, a gilbert cell is a circuit including a first circuit comprised of a pair of transistors each having an emitter grounded, and a second circuit comprised of a first pair of transistors each having an emitter grounded and a second pair of transistors each having an emitter grounded such that the transistors of the first pair and the transistors of the second pair are cross-arranged, the first circuit being electrically connected in series to the second circuit.

A gilbert cell referred to in the specification corresponds to the gilbert type multiplication circuit described at page 171 in the book titled "Technique for designing an analog integrated circuit for VLSI" published by Baifukan, authored by Gray and Meyer, and translated by Jyo Nagata.

FIG. 1 is a circuit diagram illustrating an example of a conventional double-balanced mixer circuit including a gilbert cell.

The illustrated mixer circuit is comprised of a first pair of input terminals 5A and 5B through which RF signals are input, a second pair of input terminals 6A and 6B through which local signals are input, a first transistor 2E, a second transistor 2F, a third transistor 2A, a fourth transistor 2D, a fifth transistor 2B, a sixth transistor 2C, a resistor 3A, a first output terminal 7A through which an IF signal is output, a second output terminal 7B through which an IF signal is output, a power supply terminal 8 electrically connected to a power supply (not illustrated), a first load 14A, and a second load 14B.

In the mixer circuit illustrated in FIG. 1, the first to sixth transistors 2E, 2F, 2A, 2D, 2B and 2C and the resistor 3A, enclosed with a broken line, defines a gilbert cell 1.

The input terminal 5A is electrically connected to a base of the first transistor 2E, and the input terminal 5B is electrically connected to a base of the second transistor 2F.

Emitters of the first and second transistors 2E and 2F are electrically connected to each other, and are electrically connected further to a ground 12 through the resistor 3A.

The input terminal 6A is electrically connected to bases of both the third and fourth transistors 2A and 2D, and the input terminal 6B is electrically connected to bases of both the fifth and sixth transistors 2B and 2C.

Emitters of the third and fifth transistors 2A and 2B are electrically connected to each other, and are electrically connected further to a collector of the first transistor 2E. Similarly, emitters of the sixth and fourth transistors 2C and 2D are electrically connected to each other, and are electrically connected further to a collector of the second transistor 2F.

Collectors of the third and sixth transistors 2A and 2C are electrically connected to each other, and are electrically connected further to the first output terminal 7A. The collectors of the third and sixth transistors 2A and 2C are electrically connected to the power supply terminal 8 through the first load 14A.

Collectors of the fifth and fourth transistors 2B and 2D are electrically connected to each other, and are electrically connected further to the second output terminal 7B. The collectors of the fifth and fourth transistor 2B and 2D are electrically connected to the power supply terminal 8 through the second load 14B.

The mixer circuit illustrated in FIG. 1 constitutes a double-balanced mixer circuit wherein RF and local signals are input in a balanced input style. Herein, a balanced input style means a style where there are two input terminals, and a signal is input across the two input terminals.

In operation, the mixer circuit illustrated in FIG. 1 outputs results of multiplication of signals input through the RF input terminals 5A and 5B and the local input terminals 6A and 6B, through the first and second IF output terminals 7A and 7B. Hence, a signal having a frequency equal to a sum of frequencies of the RF and local signals and a signal having a frequency equal to a difference between frequencies of the RF and local signals are output through the first and second IF output terminals 7A and 7B.

A down converter selects the signal having a frequency equal to a difference between frequencies of the RF and local signals, through a filter, and transmits the thus selected signal to a subsequent IF amplifier.

In the conventional mixer circuit illustrated in FIG. 1, since a collector current exponentially changes relative to a base voltage in the first and second transistors 2E and 2F to which RF signals are input through the input terminals 5A and 5B, distortion is likely to be generated in the first and second transistors 2E and 2F.

In order to eliminate such distortion, Japanese Unexamined Patent Publication No. 4-17405 has suggested such a mixer circuit as illustrated in FIG. 2.

The mixer circuit illustrated in FIG. 2 additionally includes a second resistor 3B and a third resistor 3C in comparison with the mixer circuit illustrated in FIG. 1.

The second resistor 3B is electrically connected at one end to an emitter of the first transistor 2E, and at the other end to both the first resistor 3A and the third resistor 3C. Similarly, the third resistor 3C is electrically connected at one end to an emitter of the second transistor 2F, and at the other end to both the first resistor 3A and the second resistor 3B.

The mixer circuit illustrated in FIG. 2 can linearize characteristics of both a collector voltage and a base voltage to thereby reduce distortion.

Japanese Unexamined Patent Publication No. 11-27170 has suggested another mixer circuit in order to eliminate the above-mentioned distortion. FIG. 3 is a circuit diagram of the mixer circuit suggested in the Publication.

The mixer circuit illustrated in FIG. 3 has the same structure as that of the mixer circuit illustrated in FIG. 1 except including a first resistor 3*a*, a second resistor 3*b* and a third resistor 3*c* in place of the resistor 3A.

The first resistor 3a is electrically connected at one end to an emitter of the first transistor 2E, and at the other end to the ground 12. The second resistor 3b is electrically connected at one end to an emitter of the second transistor 2F, and at the other end to the ground 12. The third resistor 3c is electrically connected to emitters of both the first and second transistors 2E and 2F.

However, the above-mentioned mixer circuits illustrated in FIGS. 1 to 3 are accompanied with a problem that since the resistors electrically connected to emitters of the transistors act as a feedback resistor, resulting in a loss in a conversion gain.

Representing a resistance of the feed-back resistor as "R", if a collector current varies by $\Delta Ic$, an emitter voltage varies by $R \times \Delta Ic$. The variation of an emitter voltage by $R \times \Delta Ic$ cancels a voltage Vbe between a base and an emitter. That is, since an input voltage Vin is represented as (Vbe+$R \times \Delta Ic$), the voltage Vbe is represented as (Vin-$R \times \Delta Ic$). As a result, the conversion gain is reduced.

Apart from the mixer circuits illustrated in FIGS. 1 to 3, various mixer circuits have been suggested.

For instance, Japanese Unexamined Patent Publication No. 57-71163 has suggested a double-balanced mixer circuit including a plurality pairs of differential transistors. A resistor comprised of a base diffusion layer of a bipolar transistor is electrically connected between emitters of a pair of differential transistors through which signals are input. An emitter diffusion layer is formed on the base diffusion layer. A control electrode formed on the emitter diffusion layer controls a depletion layer extending inwardly of the base diffusion layer to thereby control a resistance of the resistor.

Japanese Unexamined Patent Publication No. 7-46045, which corresponds to the U.S. application Ser. No. 083,449 filed on Jun. 28, 1993, has suggested an active mixer circuit including a first pair of local oscillators each comprised of a transistor, a second pair of local oscillators each comprised of a transistor having the same characteristic as that of the transistor in the first pair, a pair of radio-frequency matching circuits each comprised of a transistor, means for electrically connecting one the first pair of local oscillators to one of transistors constituting the radio-frequency matching circuits, means for electrically connecting one the second pair of local oscillators to the other of transistors constituting the radio-frequency matching circuits, means for electrically connecting transistors constituting the radio-frequency matching circuits, through a reactance, a local oscillator input electrically connected to control terminals of the first and second pairs of local oscillators, and a radio-frequency input electrically connected to control terminals of the pair of radio-frequency matching circuits.

Japanese Unexamined Patent Publication No. 8-32353 has suggested a frequency mixing circuit including a mixing circuit and a phase-transition circuit. The mixing circuit receives a radio-frequency signal as a first signal and a local oscillation signal as a second signal, multiplies the first signal by the second signal, and produces a mixture signal of the first and second signals and an inverted mixture signal. The phase transition circuit includes a capacitor and a resistor connected in series between an output terminal of the mixture signal and an output terminal of the inverted mixture signal, and outputs an intermediate frequency signal from a connection at which the capacitor is connected to the resistor.

Japanese Unexamined Patent Publication No. 10-126300 has suggested a mixer circuit including first means for inputting a local oscillation signal, a first circuit for buffering the local oscillation signal, a second circuit for changing a frequency, and second means for inputting RF signals. In the mixer circuit, a received RF signal and the local oscillation signal are input into the second circuit, and resultingly, an intermediate frequency signal is produced.

The second circuit includes a first differential circuit where a drain of a fifth transistor is electrically connected to a connection point at which sources of first and second transistors are electrically connected to each other, a second differential circuit where a drain of a sixth transistor is electrically connected to a connection point at which sources of third and fourth transistors are electrically connected to each other, and a double-balanced frequency-changing circuit including a first power source, a first input terminal through which a first local oscillation signal is input and at which gates of the first and fourth transistors are electrically connected to each other, a second input terminal through which a second local oscillation signal is input and at which gates of the second and third transistors are electrically connected to each other, a first output terminal through which a first intermediate frequency signal is output and at which drains of the first and third transistors are electrically connected to each other, a second output terminal through which a second intermediate frequency signal is output and at which drains of the second and fourth transistors are electrically connected to each other, and a third input terminal through which a first RF signal is input and which is electrically connected to a gate of the fifth transistor, and a fourth input terminal through which a second RF signal is input and which is electrically connected to a gate of the sixth transistor.

A source of the fifth transistor is electrically connected to the first power source through a first resistor, and a source of the sixth transistor is electrically connected to the first power source through a second resistor. The first resistor is electrically connected in parallel to the seventh transistor, and the second resistor is electrically connected in parallel to the eighth transistor. Gates of the seventh and eighth transistors are electrically connected to each other through third and fourth resistors. Means for controlling a gain in the double-balanced frequency-changing circuit is designed to have a terminal for controlling a gain voltage.

However, the above-mentioned problem of reduction in a conversion gain remains unsolved even in the above-mentioned Publications.

SUMMARY OF THE INVENTION

In view of the above-mentioned problem, it is an object of the present invention to provide a mixer circuit which is capable of reducing distortion with reduction in a conversion gain being minimized.

There is provided a mixer circuit including (a) a first input terminal, (b) a second input terminal, (c) a third input terminal, (d) a fourth input terminal, (e) a first transistor having a base electrically connected to the first input terminal, (f) a second transistor having a base electrically connected to the second input terminal, (g) a third transistor having a base electrically connected to the third input terminal, (h) a fourth transistor having a base electrically connected to the third input terminal, (i) a fifth transistor having a base electrically connected to the fourth input terminal, (j) a sixth transistor having a base electrically connected to the fourth input terminal, the first transistor having a collector electrically connected to emitters of the third and fifth transistors, the second transistor having a collector electrically connected to emitters of the fourth and sixth transistors, the third transistor having a collector electrically connected to a collector of the sixth transistor, the fourth transistor having a collector electrically connected to a collector of the fifth transistor, (k) a first impedance element connected between the first input terminal and the second transistor, and (l) a second impedance element connected between the second input terminal and the first transistor.

It is preferable that the first and second impedance elements have the same electric characteristics.

For instance, each of the first and second impedance elements may be comprised of a capacitor or a resistor. As an alternative, each of the first and second impedance elements may be comprised of a combination of a coil, a capacitor and a resistor electrically connected in series to one another. As an alternative, each of the first and second impedance elements may be comprised of any two of a coil, a capacitor and a resistor, electrically connected in series to each other.

It is preferable that emitters of the first and second transistors are grounded.

The mixer circuit may further include a resistor electrically connected at one end to emitters of the first and second transistors and at the other end grounded.

The mixer circuit may further include a first resistor electrically connected at one end to an emitter of the first transistor and at the other end grounded, and a second resistor electrically connected at one end to an emitter of the second transistor and at the other end grounded.

The mixer circuit may further include a first resistor electrically connected at one end to an emitter of the first transistor, a second resistor electrically connected at one end to an emitter of the second transistor, and a third resistor electrically connected at one end to the other ends of the first and second resistors and at the other end grounded.

The mixer circuit may further include a first resistor electrically connected at one end to an emitter of the first transistor and at the other end grounded, a second resistor electrically connected at one end to an emitter of the second transistor and at the other end grounded, and a third resistor electrically connected the emitters of the first and second transistors to each other.

The mixer circuit may further include a first load electrically connected at one end to a power supply terminal and at the other end to both collectors of the third and sixth transistors and a first output terminal, and a second load electrically connected at one end to a power supply terminal and at the other end to both collectors of the fifth and fourth transistors and a second output terminal.

The mixer circuit may further include a first coil electrically connected at one end to a power supply terminal and at the other end to both collectors of the third and sixth transistors and a first output terminal, and a second coil electrically connected at one end to a power supply terminal and at the other end to both collectors of the fifth and fourth transistors and a second output terminal.

For instance, each of the first to sixth transistors may be comprised of a GaAs heterojunction bipolar transistor.

It is preferable that the third, fourth, fifth and sixth transistors are half in size relative to the first and second transistors, and have a constant bias-current density.

The advantages obtained by the aforementioned present invention will be described hereinbelow.

In accordance with the present invention, a base of a first transistor and a collector of a second transistor where a radio-frequency signal is input to the first and second transistors in the same phase, are electrically connected to each other through an impedance element. This ensures that an input signal can be introduced into an emitter of a transistor to which a local signal is input, without a part of the input signal being distorted. Accordingly, the present invention can improve both a conversion gain and distortion in comparison with a conventional mixer circuit.

In the mixer circuit in accordance with the present invention, a first signal is input into a base of a first transistor, and a second signal having an inverted phase to the first signal is input into a base of a second transistor. In general, a collector voltage in a transistor varies in an inverted phase relative to a base voltage. Accordingly, a signal input into a base of the first transistor has the same phase as a phase of a signal input into a base of the second transistor.

In addition, in the present invention, a radio-frequency input signal is input into both a base of the first transistor and a collector of the second transistor operating in the same phase as that of the first transistor, through the first impedance element, and a radio-frequency input signal is input into both a base of the second transistor and a collector of the first transistor through the second impedance element having the same electric characteristics as those of the first impedance element.

A signal input into a base is distorted due to the non-linearity of a transistor, and appears at a collector in the distorted form. In contrast, a signal input directly to a collector is not distorted at all. Accordingly, it would be possible to minimize distortion in collector currents in the first and second transistors in comparison with a collector current in the conventional mixer circuit, resulting in that distortion in a resultant intermediate frequency signal can be reduced.

Since a part of a signal is input into a collector, it would not be possible to obtain such a conversion gain as one in the circuit illustrated in FIG. 1 wherein the resistor 3A is electrically connected to the emitters of the first and second transistors 2E and 2F. However, it would be possible to obtain the same distortion characteristic, even if no resistor is electrically connected to the emitters of the first and second transistors 2E and 2F in the mixer circuit illustrated in FIG. 1, or even if resistors having a smaller resistance are used in the mixer circuits illustrated in FIGS. 2 and 3 in place of the resistors 3A to 3C and 3a to 3c. Hence, the present invention provides a mixer circuit capable of accomplishing higher performances than those of the conventional mixer circuit with respect to a conversion gain and reduction in distortion.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 4:
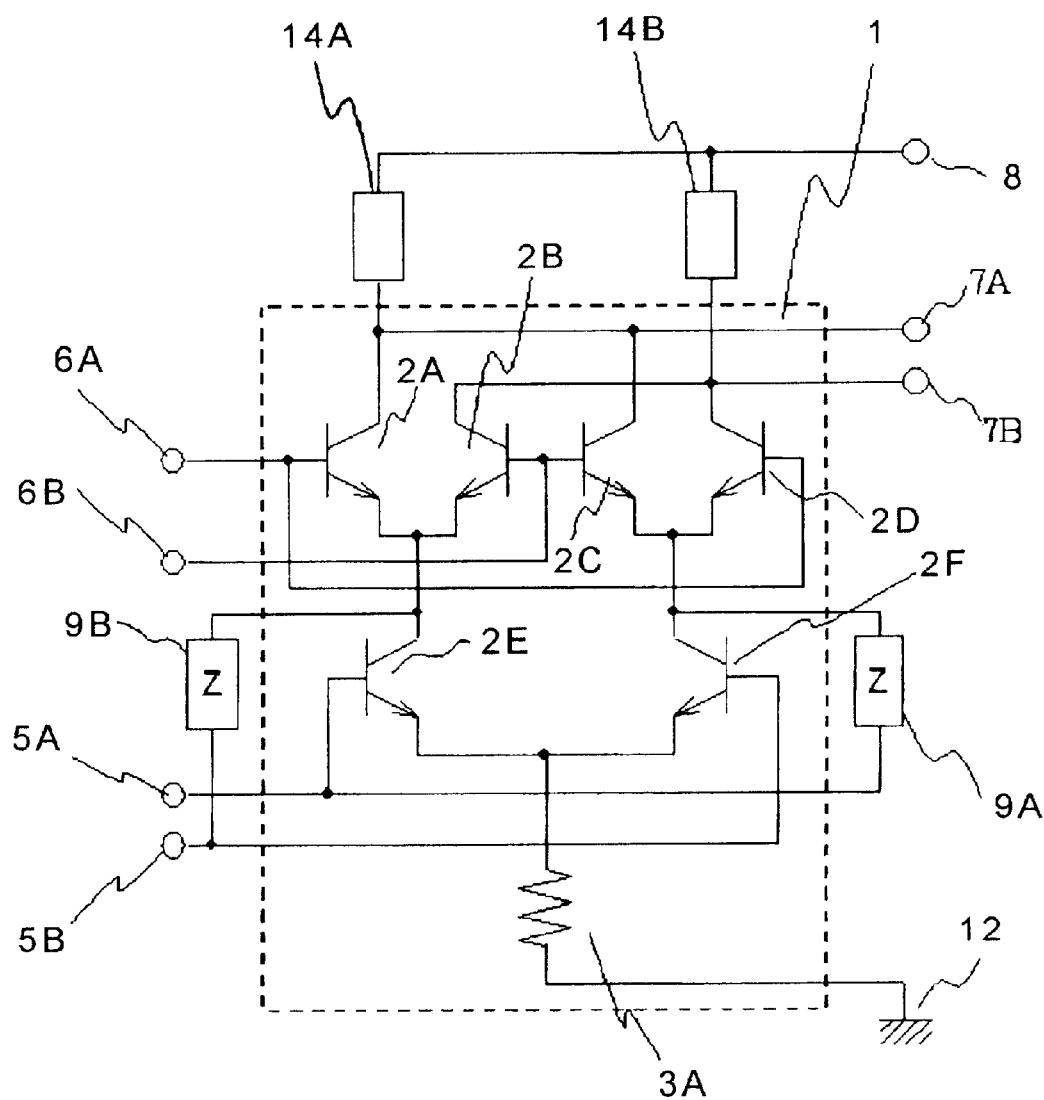
FIG. 4 is a circuit diagram of a mixer circuit in accordance with the first embodiment of the present invention.

FIG. 4 is a circuit diagram of a mixer circuit in accordance with the first embodiment.

The illustrated mixer circuit is comprised of a first pair of input terminals 5A and 5B through which radio-frequency (RF) signals are input, a second pair of input terminals 6A and 6B through which local signals are input, a first transistor 2E, a second transistor 2F, a third transistor 2A, a fourth transistor 2D, a fifth transistor 2B, a sixth transistor 2C, a resistor 3A, a first output terminal 7A through which an intermediate frequency (IF) signal is output, a second output terminal 7B through which an IF signal is output, a power supply terminal 8 electrically connected to a power supply (not illustrated), a first load 14A, a second load 14B, a first impedance element 9A, and a second impedance element 9B.

In the mixer circuit illustrated in FIG. 4, the first to sixth transistors 2E, 2F, 2A, 2D, 2B and 2C and the resistor 3A, enclosed with a broken line, defines a gilbert cell 1.

The input terminal 5A is electrically connected to a base of the first transistor 2E, and further to a collector of the second transistor 2F through the first impedance element 9A, and the input terminal 5B is electrically connected to a base of the second transistor 2F, and further to a collector of the first transistor 2E through the second impedance element 9B.

Emitters of the first and second transistors 2E and 2F are electrically connected to each other, and are electrically connected further to a ground 12 through the resistor 3A.

The input terminal 6A is electrically connected to bases of both the third and fourth transistors 2A and 2D, and the input terminal 6B is electrically connected to bases of both the fifth and sixth transistors 2B and 2C.

Emitters of the third and fifth transistors 2A and 2B are electrically connected to each other, and are electrically connected further to a collector of the first transistor 2E. Similarly, emitters of the sixth and fourth transistors 2C and 2D are electrically connected to each other, and are electrically connected further to a collector of the second transistor 2F.

Collectors of the third and sixth transistors 2A and 2C are electrically connected to each other, and are electrically connected further to the first output terminal 7A. The collectors of the third and sixth transistors 2A and 2C are electrically connected to the power supply terminal 8 through the first load 14A.

Collectors of the fifth and fourth transistors 2B and 2D are electrically connected to each other, and are electrically connected further to the second output terminal 7B. The collectors of the fifth and fourth transistors 2B and 2D are electrically connected to the power supply terminal 8 through the second load 14B.

The first impedance element 9A is electrically connected between the input terminal 5A and a connection point at which a collector of the second transistor 2F and the emitters of the sixth and fourth transistors 2C and 2D are connected to each other. The second impedance element 9B is electrically connected between the input terminal 5B and a connection point at which a collector of the first transistor 2E and the emitters of the third and fifth transistors 2A and 2B are connected to each other.

In the mixer circuit, balanced RF signals are input into the input terminals 5A and 5B, and balanced local signals are input into the input terminals 6A and 6B. That is, a signal input into the input terminals 5A and 5B has a phase difference of 180 degrees from a signal input into the input terminals 6A and 6B.

In the mixer circuit in accordance with the first embodiment, a signal to be input into a base of the first transistor 2E has a phase which is inverted to a phase of a signal to be input into a base of the second transistor 2F. In addition, in general, a collector voltage in a transistor varies in an inverted phase relative to a base voltage. Accordingly, a signal in a base of the first transistor 2E has the same phase as a phase of a signal in a collector of the second transistor 2F, and a signal in a base of the second transistor 2F has the same phase as a phase of a signal in a collector of the first transistor 2E.

A signal input through the input terminal 5A is introduced into a base of the first transistor 2E and a collector of the second transistor 2F, which operates in the same phase as a phase of the base of the first transistor 2E, through the first impedance element 9A. Similarly, a signal input through the input terminal 5B is introduced into a base of the second transistor 2F and a collector of the first transistor 2E, which operates in the same phase as a phase of a base of the second transistor 2F, through the second impedance element 9B.

The RF signals input into the bases of the first and second transistors 2E and 2F are distorted due to the non-linearity of the transistors, and appears at the collectors of the first and second transistors 2E and 2F as distorted collector currents. In contrast, a signal input directly to the collectors of the first and second transistors 2E and 2F is not distorted at all. Accordingly, it would be possible to minimize distortion in the collector currents in the first and second transistors 2E and 2F in comparison with a collector current in the conventional mixer circuit, resulting in that distortion in a resultant intermediate frequency signal can be reduced.

Figure 1:
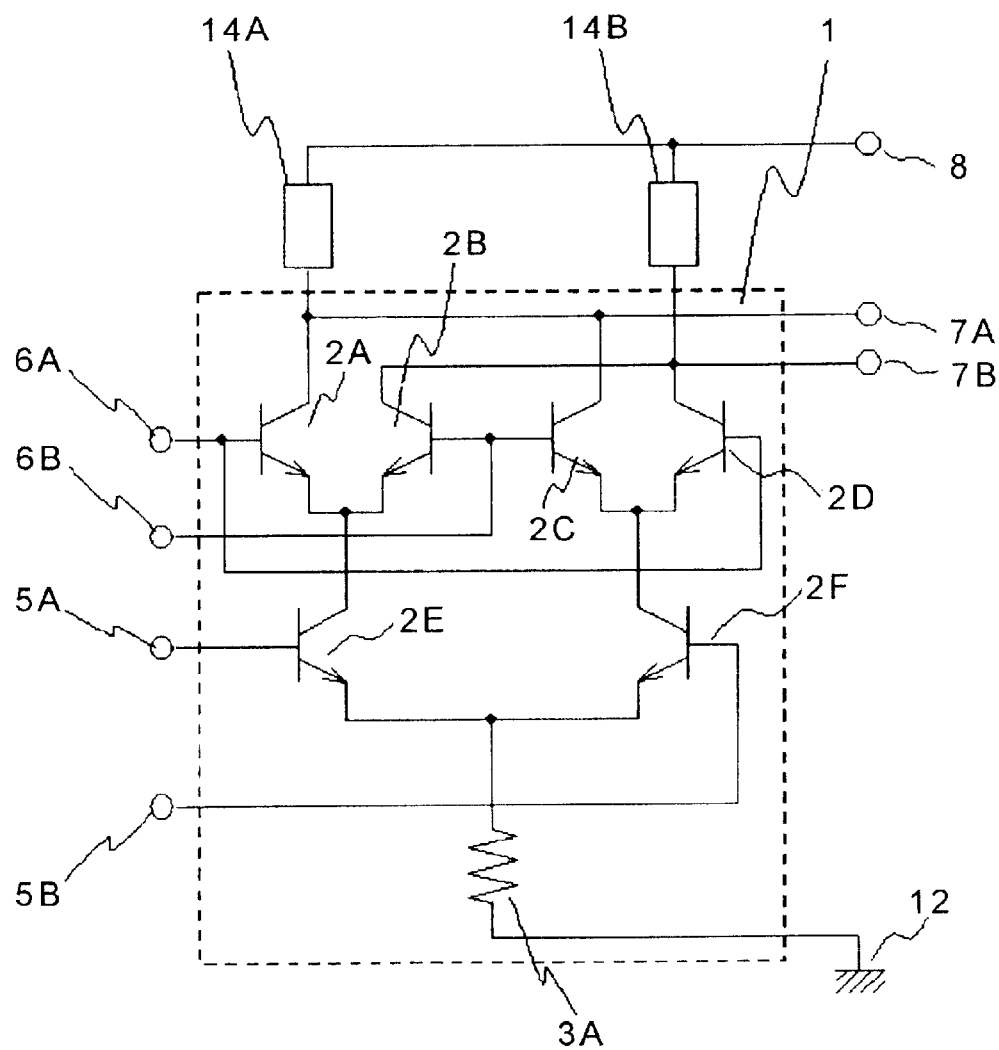
FIG. 1 is a circuit diagram of a conventional mixer circuit.

Since a part of the RF signals is input into the collectors of the first and second transistors 2E and 2F, it would not be possible to obtain such a conversion gain as one in the circuit illustrated in FIG. 1 wherein the resistor 3A is electrically connected to the emitters of the first and second transistors 2E and 2F. However, it would be possible to obtain the same distortion characteristic, even if no resistor is electrically connected to the emitters of the first and second transistors 2E and 2F, or even if resistors having a smaller resistance than that of the resistors 3A to 3C and 3a to 3c are used. Hence, the first embodiment provides a mixer circuit capable of accomplishing higher performances than performances of the conventional mixer circuit with respect to a conversion gain and reduction in distortion.

Figure 5:
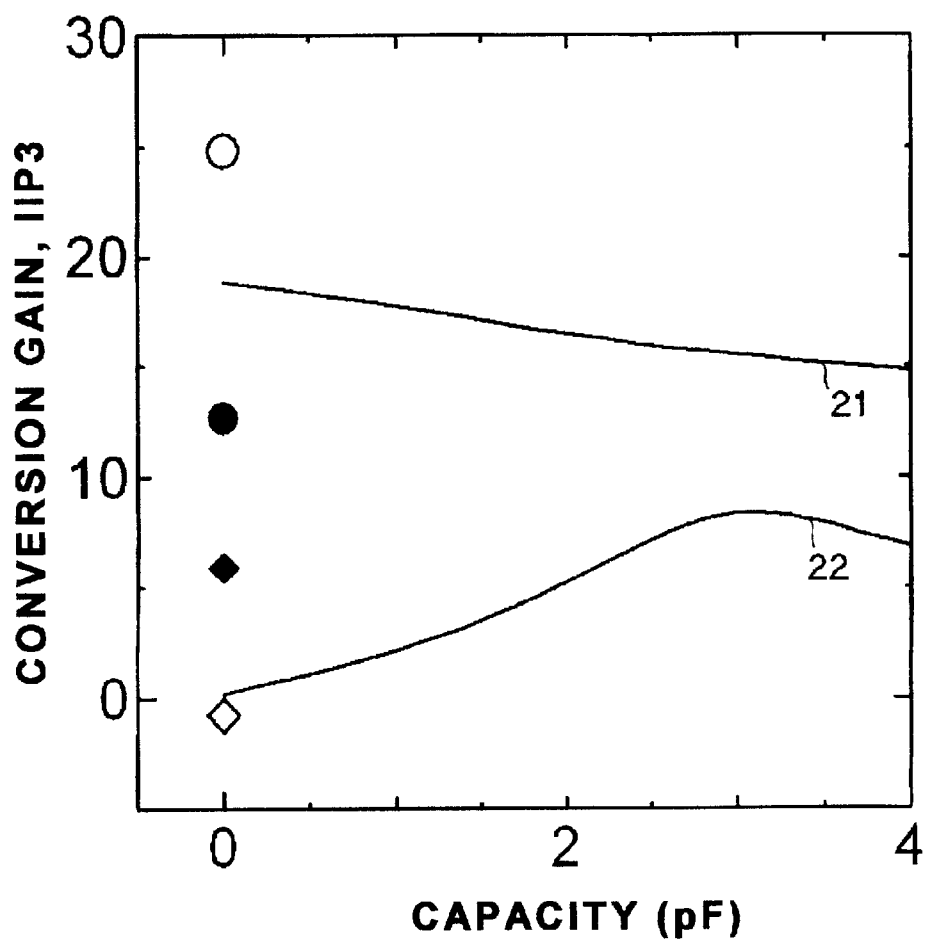
FIG. 5 is a graph showing comparison in a conversion gain and IIP3 between the mixer circuit illustrated in FIG. 4 and the conventional mixer circuit.

FIG. 5 shows the results obtained by simulating converting a frequency from 2 GHz to 100 MHz. In FIG. 5, input equivalence third-order interactive modulation distortion intercept point (IIP3) is used as an indication of distortion. Greater IIP3 indicates lower distortion. In FIG. 5, a line 21 indicates a conversion gain, and a line 22 indicates IIP3.

With reference to FIG. 5, since the conventional mixer circuit has no capacitors, a conversion gain and IIP3 in the conventional mixer circuit are plotted at zero in the abscissa axis indicating a capacity.

In FIG. 5, a hollow circle (○) and a solid circle (●) indicate a conversion gain, and a hollow rhombus (◇) and a solid rhombus (◆) indicate IIP3. In addition, the solid circle (●) and the solid rhombus (◆) indicate a conversion gain and IIP3 in the conventional mixer circuit having a resistor such as the resistor 3A having a resistance of 30 ohms, and the hollow circle (○) and the hollow rhombus (◇) indicate a conversion gain and IIP3 in the conventional mixer circuit not including such a resistor.

As obvious in view of the solid circle (●) indicative of a conversion gain in the conventional mixer circuit including a resistor having a resistance of 30 ohms, the conversion gain is smaller than a conversion gain, indicated by the hollow circle (○), in the conventional mixer circuit having no resistor. In contrast, as obvious in view of the solid rhombus (◆) indicative of IIP3 in the conventional mixer circuit including a resistor having a resistance of 30 ohms, the IIP3 is greater than IIP3, indicated by the hollow rhombus (◇), in the conventional mixer circuit having no resistor.

Hereinbelow is explained a definition of IIP3.

In general, when an input voltage is varied, an output voltage is increased accordingly. Hence, if input voltages are plotted in an abscissa axis and output voltages are plotted in an ordinate axis both in the unit of decibel (dB), there will be obtained a line having an inclination of one (1).

In addition, there also appears an output called three-order interactive modulation distortion (IM3) indicative of distortion caused by three-order higher harmonics. Since the three-order interactive modulation distortion is in proportion to a cube of an input, the three-order interactive modulation distortion will make a line having an inclination of three (3).

An intersection of extensions of those two lines is called an intercept point (IP3), and an input voltage at the intersection is called IIP3.

The above-mentioned IM3 may be defined as an output obtained at frequencies of $(2f_1-f_2)$ and $(2f_2-f_1)$ due to three-order distortion, when two signals having frequencies of $f_1$ and $f_2$ which are close to each other are input.

In FIG. 5, capacitors are used as the first and second impedance elements 9A and 9B. When a capacity of the capacitor is equal to or greater than 2 pF, the IIP3 represented with the line 22 is greater than IIP3 in the conventional mixer circuit including the resistor having a resistance of 30 ohms. Hence, the conversion gain represented with the line 21 is also greater than the same in the conventional mixer circuit.

[Second Embodiment]

Figure 6:
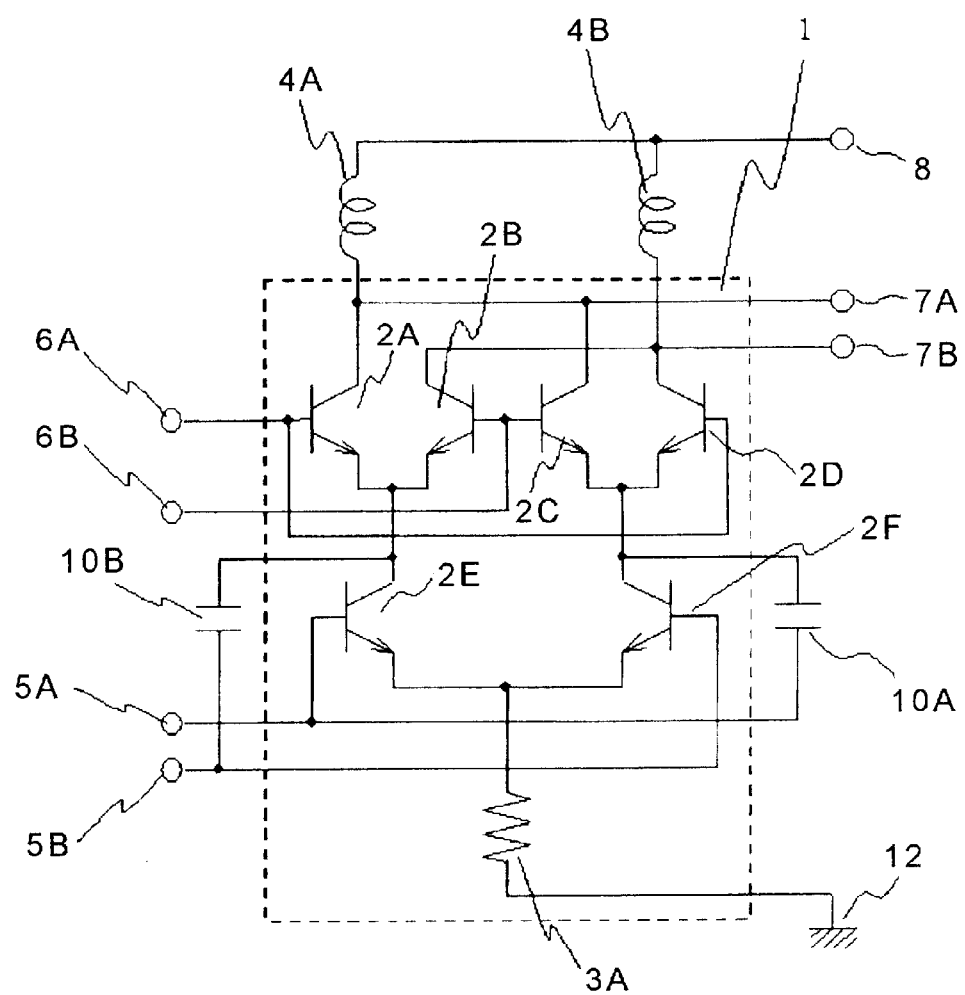
FIG. 6 is a circuit diagram of a mixer circuit in accordance with the second embodiment of the present invention.

FIG. 6 is a circuit diagram of a mixer circuit in accordance with the second embodiment.

The illustrated mixer circuit in accordance with the second embodiment is structurally different from the mixer circuit in accordance with the first embodiment, illustrated in FIG. 4, only in that first and second capacitors 10A and 10B are used as the first and second impedance elements 9A and 9B, and first and second coils 4A and 4B are used as the first and second loads 14A and 14B.

In the second embodiment, the resistor 3A is designed to have a resistance of 100 ohms, and each of the first and second coils 4A and 4B is designed to have an inductance of 100 nH.

The first to sixth transistors 2E, 2F, 2A, 2D, 2B and 2C are all GaAs heterojunction bipolar transistors (HBT). The third to sixth transistors 2A, 2D, 2B and 2C are designed to have a half size of the first and second transistors 2E and 2F, and to have a constant bias current density.

A total current in the mixer circuit is set at 10 mA.

Figure 2:
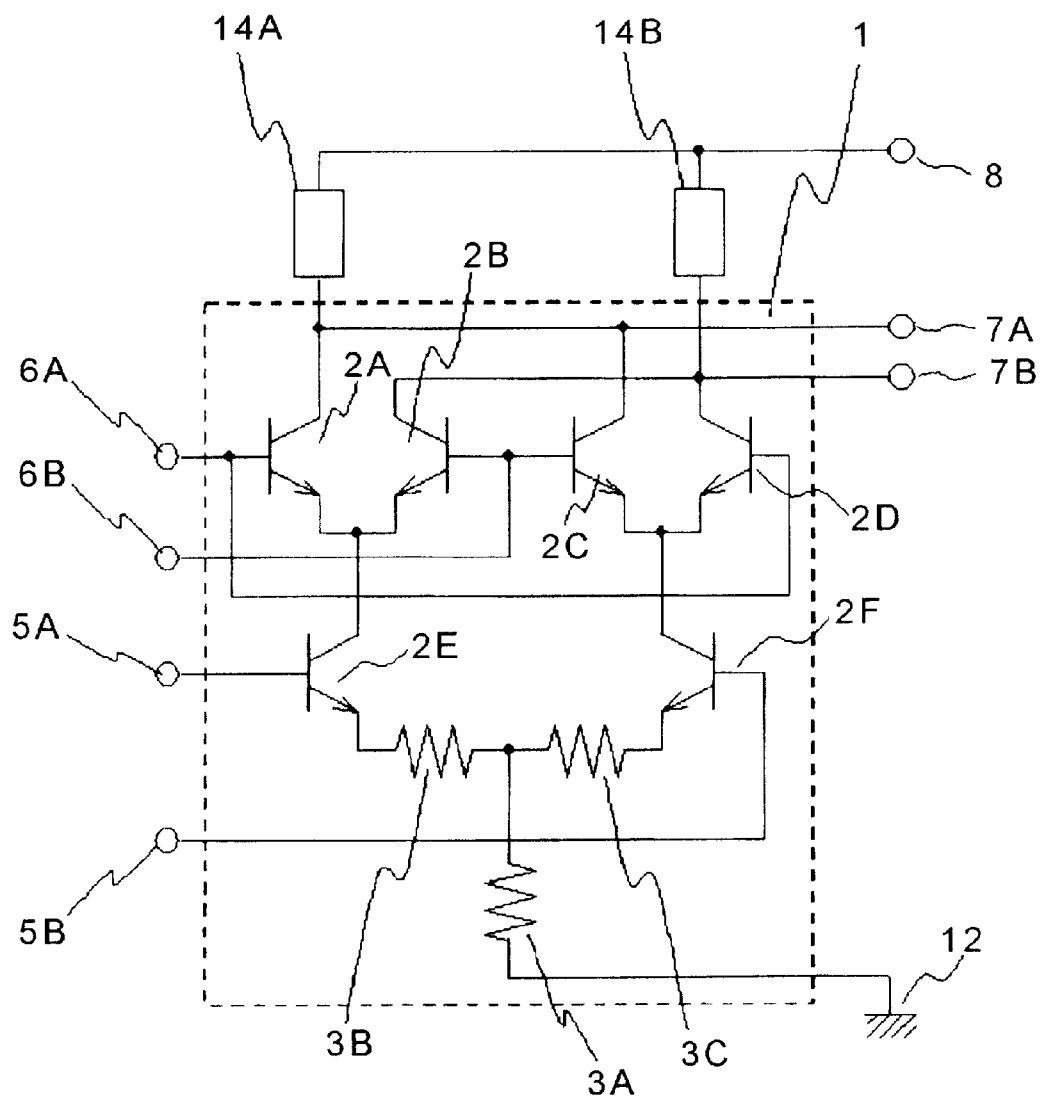
FIG. 2 is a circuit diagram of another conventional mixer circuit.
Figure 3:
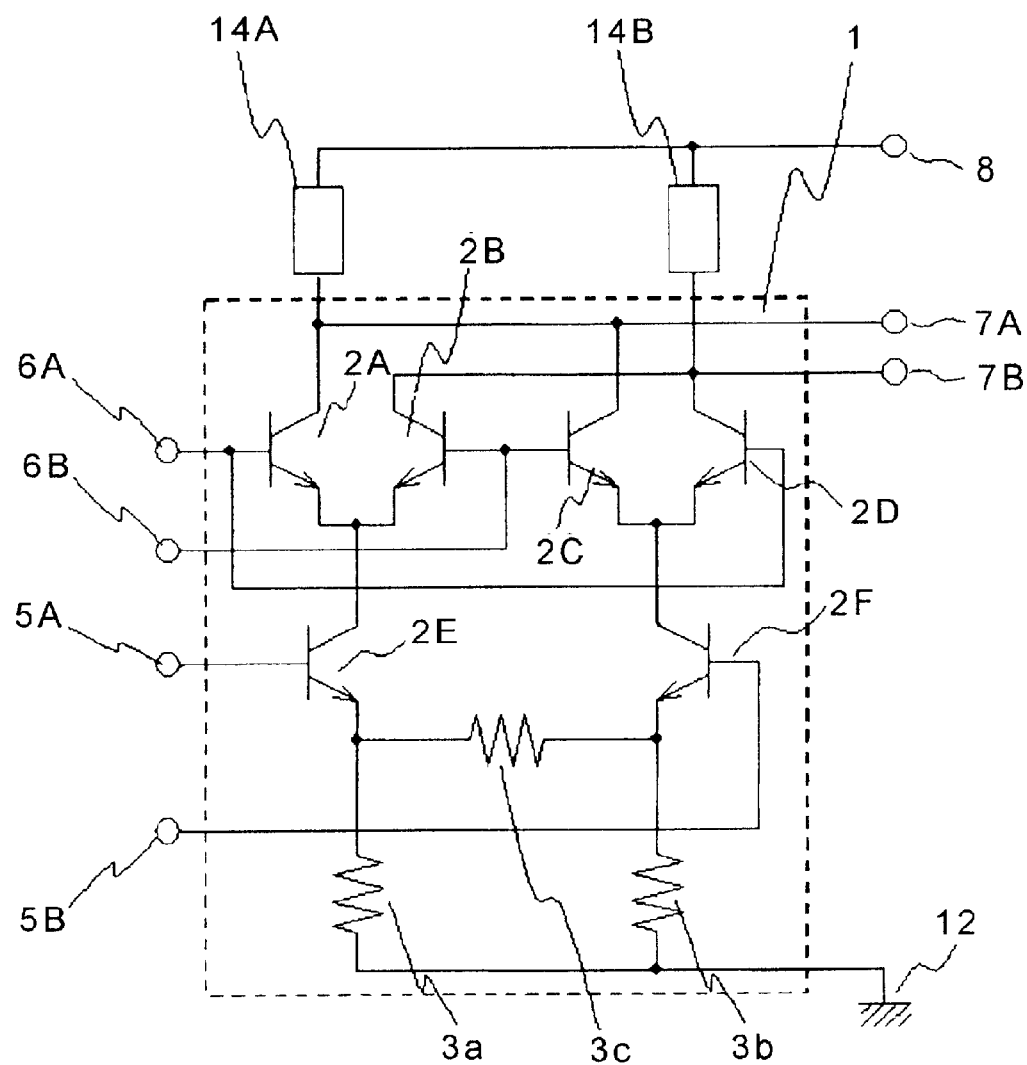
FIG. 3 is a circuit diagram of still another conventional mixer circuit.

In the second embodiment, when a radio signal frequency of 2 GHz was converted to an intermediate frequency of 100 MHz, the conversion gain was 16 dB, and IIP3 was 5 dBm. These are higher than those of the conventional mixer circuit illustrated in FIG. 2, having the same parameters in parts constituting a mixer circuit, where the conversion gain was 13 dB, and IIP3 was 0 dBm.

[Third Embodiment]

Figure 7:
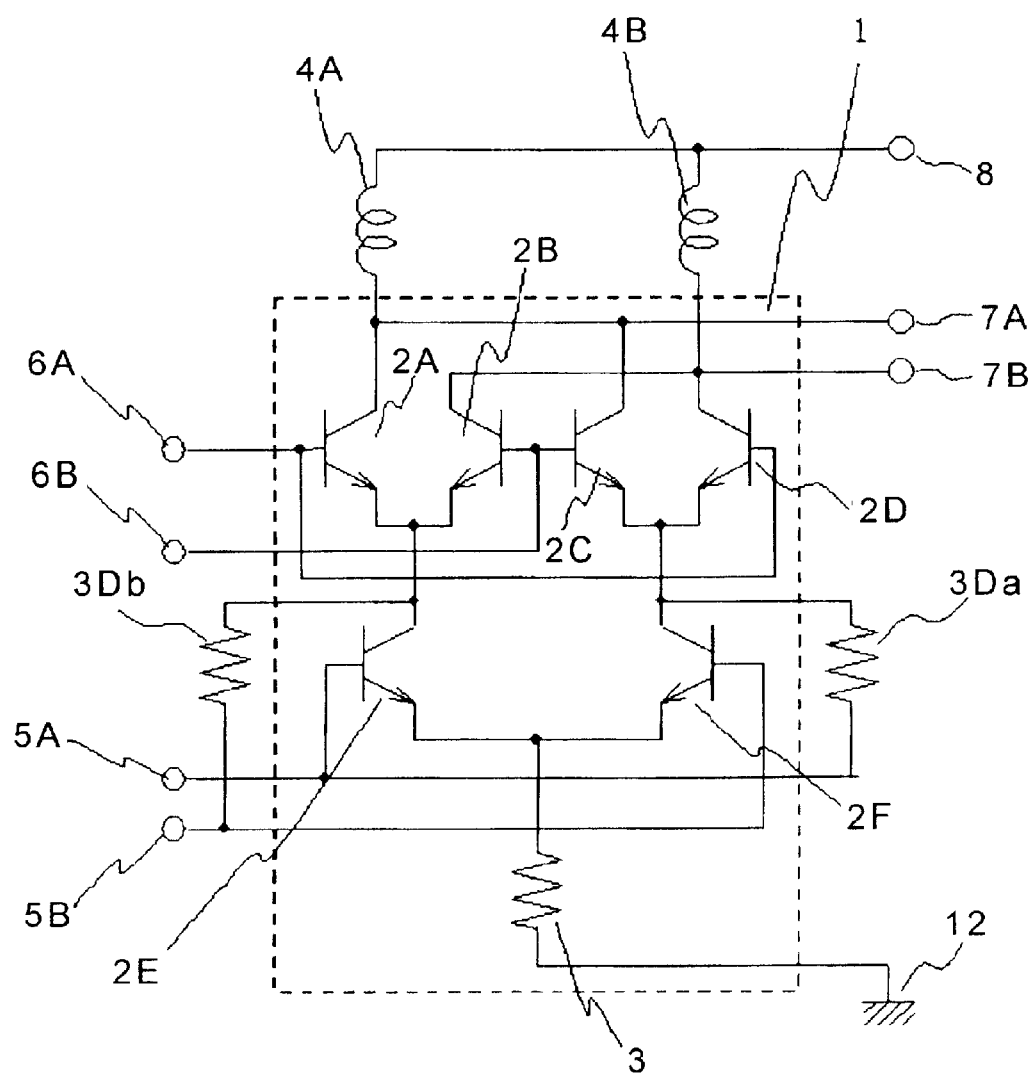
FIG. 7 is a circuit diagram of a mixer circuit in accordance with the third embodiment of the present invention.

FIG. 7 is a circuit diagram of a mixer circuit in accordance with the third embodiment.

The illustrated mixer circuit in accordance with the third embodiment is structurally different from the mixer circuit in accordance with the first embodiment, illustrated in FIG. 4, only in that first and second resistors 3Da and 3Db are used as the first and second impedance elements 9A and 9B, and first and second coils 4A and 4B are used as the first and second loads 14A and 14B.

In the third embodiment, the resistor 3A is designed to have a resistance of 100 ohms, and each of the first and second coils 4A and 4B is designed to have an inductance of 100 nH.

The first to sixth transistors 2E, 2F, 2A, 2D, 2B and 2C are all GaAs heterojunction bipolar transistors (HBT). The third to sixth transistors 2A, 2D, 2B and 2C are designed to have a half size of the first and second transistors 2E and 2F, and to have a constant bias current density.

A total current in the mixer circuit is set at 10 mA.

In the third embodiment, when a radio signal frequency of 2 GHz was converted to an intermediate frequency of 100 MHz, the conversion gain was 15 dB, and IIP3 was 6 dBm. These are higher than those of the conventional mixer circuit illustrated in FIG. 2, having the same parameters in parts constituting a mixer circuit, where the conversion gain was 13 dB, and IIP3 was 0 dBm.

[Fourth Embodiment]

Figure 8:
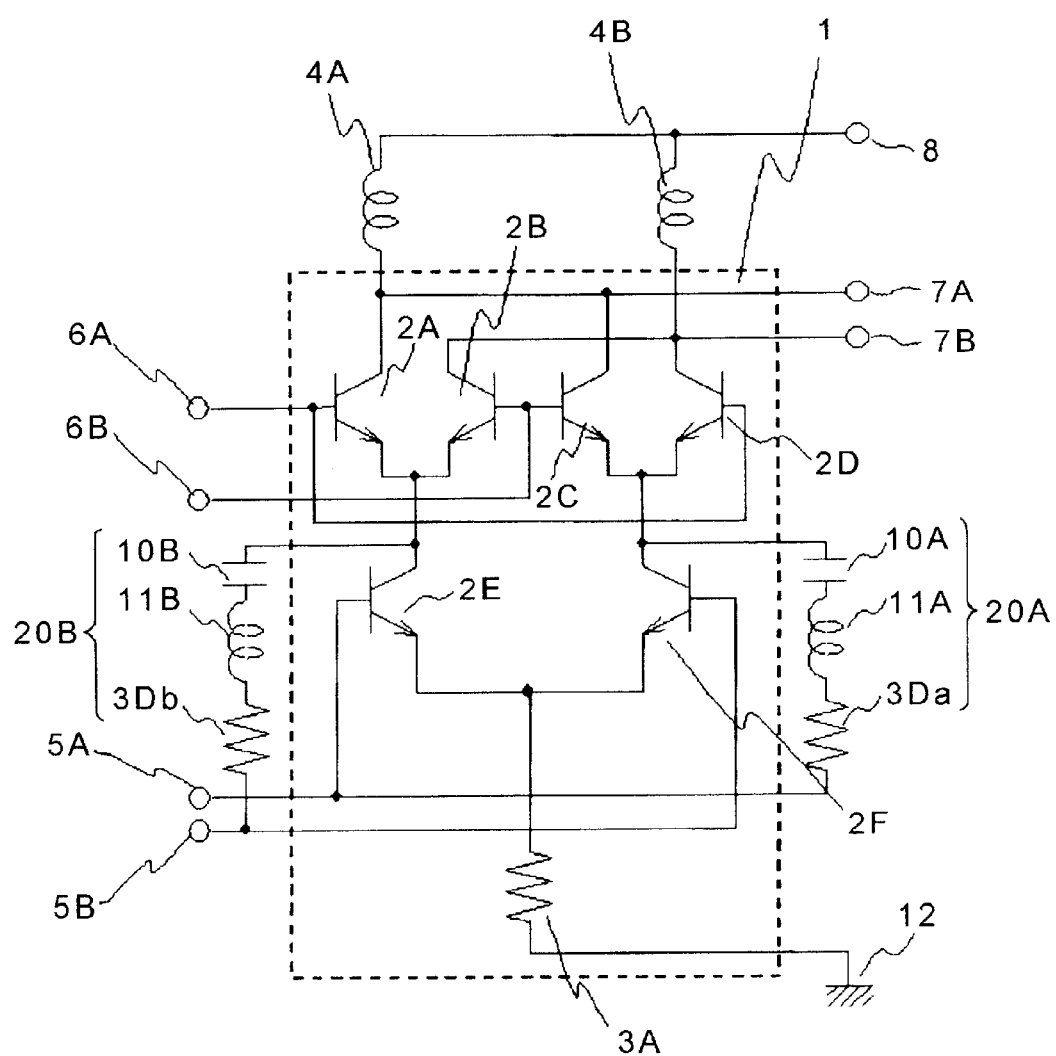
FIG. 8 is a circuit diagram of a mixer circuit in accordance with the fourth embodiment of the present invention.

FIG. 8 is a circuit diagram of a mixer circuit in accordance with the fourth embodiment.

The illustrated mixer circuit in accordance with the fourth embodiment is structurally different from the mixer circuit in accordance with the first embodiment, illustrated in FIG. 4, only in that first and second combination circuits 20A and 20B are used as the first and second impedance elements 9A and 9B, and first and second coils 4A and 4B are used as the first and second loads 14A and 14B.

The first combination circuit 20A is comprised of a first capacitor 10A, a first coil 11A and a first resistor 3Da all electrically connected in series to one another. Similarly, the second combination circuit 20B is comprised of a second capacitor 10B, a second coil 11B and a second resistor 3Db all electrically connected in series to one another.

In the fourth embodiment, the resistor 3A is designed to have a resistance of 100 ohms, and each of the first and second coils 4A and 4B is designed to have an inductance of 100 nH.

The first to sixth transistors 2E, 2F, 2A, 2D, 2B and 2C are all GaAs heterojunction bipolar transistors (HBT). The third to sixth transistors 2A, 2D, 2B and 2C are designed to have a half size of the first and second transistors 2E and 2F, and to have a constant bias current density.

A total current in the mixer circuit is set at 10 mA.

In the fourth embodiment, when a radio signal frequency of 2 GHz was converted to an intermediate frequency of 100

MHz, the conversion gain was 16 dB, and IIP3 was 4 dBm. These are higher than those of the conventional mixer circuit illustrated in FIG. 2, having the same parameters in parts constituting a mixer circuit, where the conversion gain was 13 dB, and IIP3 was 0 dBm.

The first and second combination circuits 20A and 20B, each comprising the first capacitor 10A, the first coil 11A, and the first resistor 3Da, and the second capacitor 10B, the second coil 11B, and the second resistor 3Db, respectively, make oscillation circuits, and exhibit a lowest impedance at 2 GHz. When the first and second combination circuits 20A and 20B exhibit a lowest impedance, a signal input directly to the collectors of the first and second transistors 2E and 2F is increased, and accordingly, IIP3 is also increased.

Though the first and second combination circuits 20A and 20B are designed to include a resistor, a capacitor and a coil, it should be noted that the first and second combination circuits 20A and 20B may be designed to include any two of a resistor, a capacitor, and a coil. Specifically, each of the first and second combination circuits 20A and 20B may be designed to include (a) a capacitor and a coil, (b) a capacitor and a resistor, or (c) a coil and a resistor.

[Fifth Embodiment]

Figure 9:
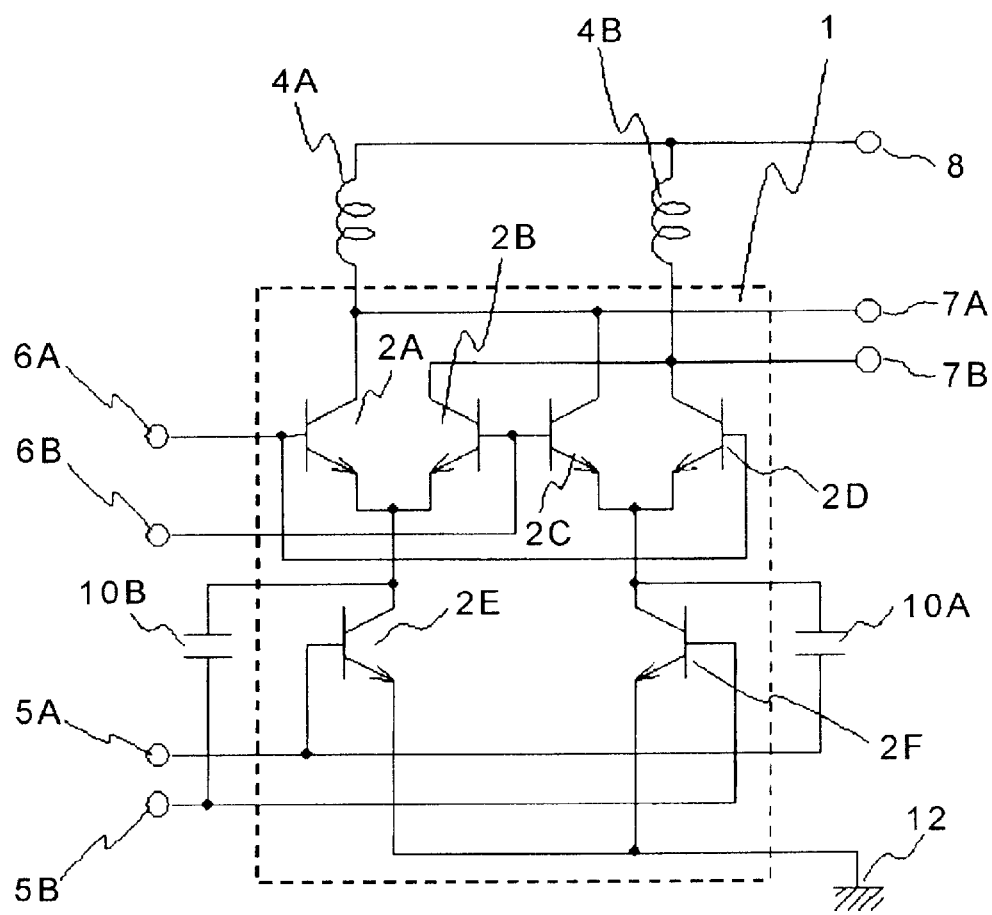
FIG. 9 is a circuit diagram of a mixer circuit in accordance with the fifth embodiment of the present invention.

FIG. 9 is a circuit diagram of a mixer circuit in accordance with the fifth embodiment.

The illustrated mixer circuit in accordance with the fifth embodiment is structurally different from the mixer circuit in accordance with the first embodiment, illustrated in FIG. 4, only in that first and second capacitors 10A and 10B are used as the first and second impedance elements 9A and 9B, first and second coils 4A and 4B are used as the first and second loads 14A and 14B, and the mixer circuit in accordance with the fifth embodiment includes no resistor corresponding to the resistor 3A.

Emitters of the first and second transistors 2E and 2F are directly connected to the ground 12 unlike the mixer circuit in accordance with the first embodiment, illustrated in FIG. 4, where the emitters of the first and second transistors 2E and 2F are electrically connected to the ground 12 through the resistor 3A.

In the fifth embodiment, each of the first and second coils 4A and 4B is designed to have an inductance of 100 nH.

The first to sixth transistors 2E, 2F, 2A, 2D, 2B and 2C are all GaAs heterojunction bipolar transistors (HBT). The third to sixth transistors 2A, 2D, 2B and 2C are designed to have a half size of the first and second transistors 2E and 2F, and to have a constant bias current density.

A total current in the mixer circuit is set at 10 mA.

In the fifth embodiment, when a radio signal frequency of 2 GHz was converted to an intermediate frequency of 100 MHz, the conversion gain was 16 dB, and IIP3 was 4 dBm. These are higher than those of the conventional mixer circuit illustrated in FIG. 2, having the same parameters in parts constituting a mixer circuit, where the conversion gain was 13 dB, and IIP3 was 0 dBm.

Since the mixer circuit in accordance with the fifth embodiment is designed not to include a resistor such as the resistor 3A illustrated in FIG. 4, it would be possible in the fifth embodiment to reduce a power source voltage by a voltage drop caused by the resistor.

[Sixth Embodiment]

Figure 10:
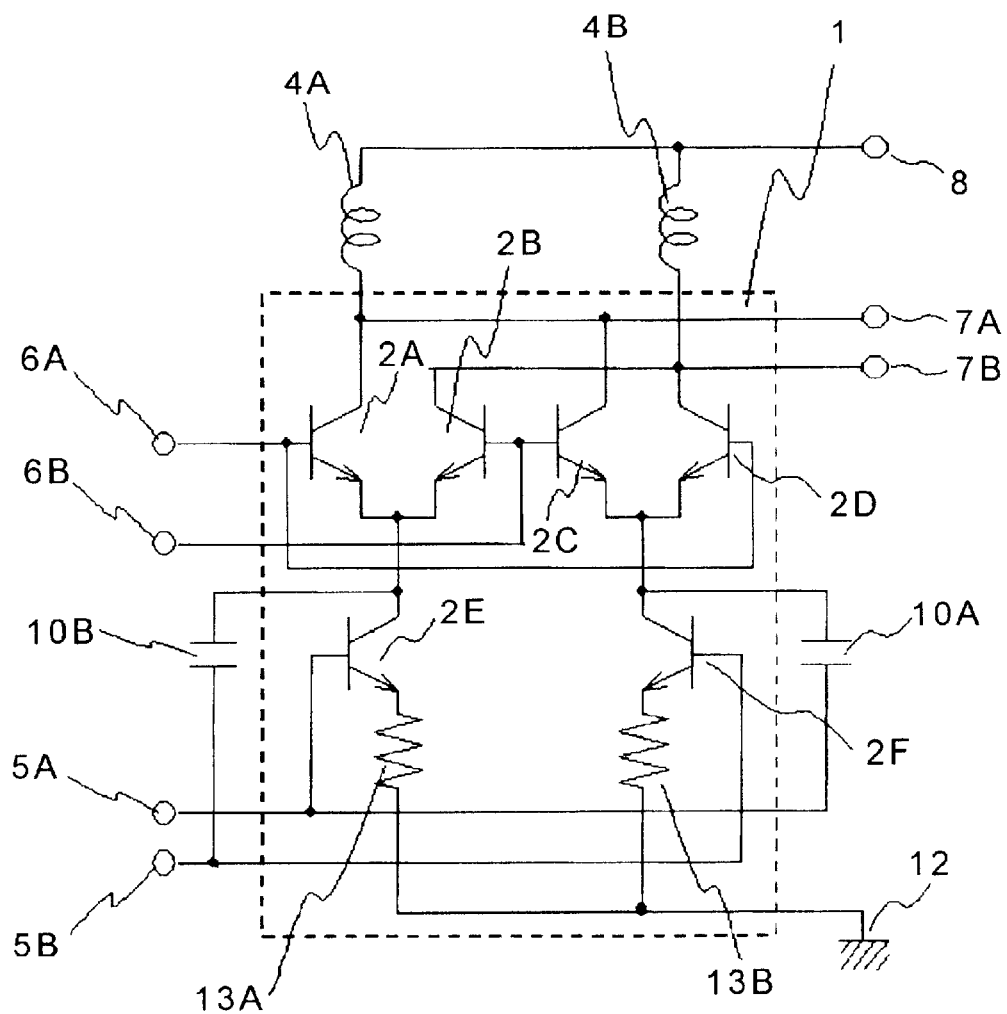
FIG. 10 is a circuit diagram of a mixer circuit in accordance with the sixth embodiment of the present invention.

FIG. 10 is a circuit diagram of a mixer circuit in accordance with the sixth embodiment.

The illustrated mixer circuit in accordance with the sixth embodiment is structurally different from the mixer circuit in accordance with the fifth embodiment, illustrated in FIG. 9, only in that an emitter of the first transistor 2E is electrically connected to the ground 12 through a first resistor 13A, and an emitter of the second transistor 2F is electrically connected to the ground 12 through a second resistor 13B.

The first and second resistors 13A and 13B are both designed to have a resistance of 10 ohms.

In the sixth embodiment, when a radio signal frequency of 2 GHz was converted to an intermediate frequency of 100 MHz, the conversion gain was 13 dB, and IIP3 was 8 dBm. These are higher than those of the conventional mixer circuit illustrated in FIG. 2, having the same parameters in parts constituting a mixer circuit, where the conversion gain was 13 dB, and IIP3 was 0 dBm.

In comparison with the fifth embodiment, though the conversion gain is reduced, IIP3 is increased. Hence, the mixer circuit in accordance with the sixth embodiment can operate with a smaller distortion than a distortion with which the mixer circuit in accordance with the fifth embodiment operates.

[Seventh Embodiment]

Figure 11:
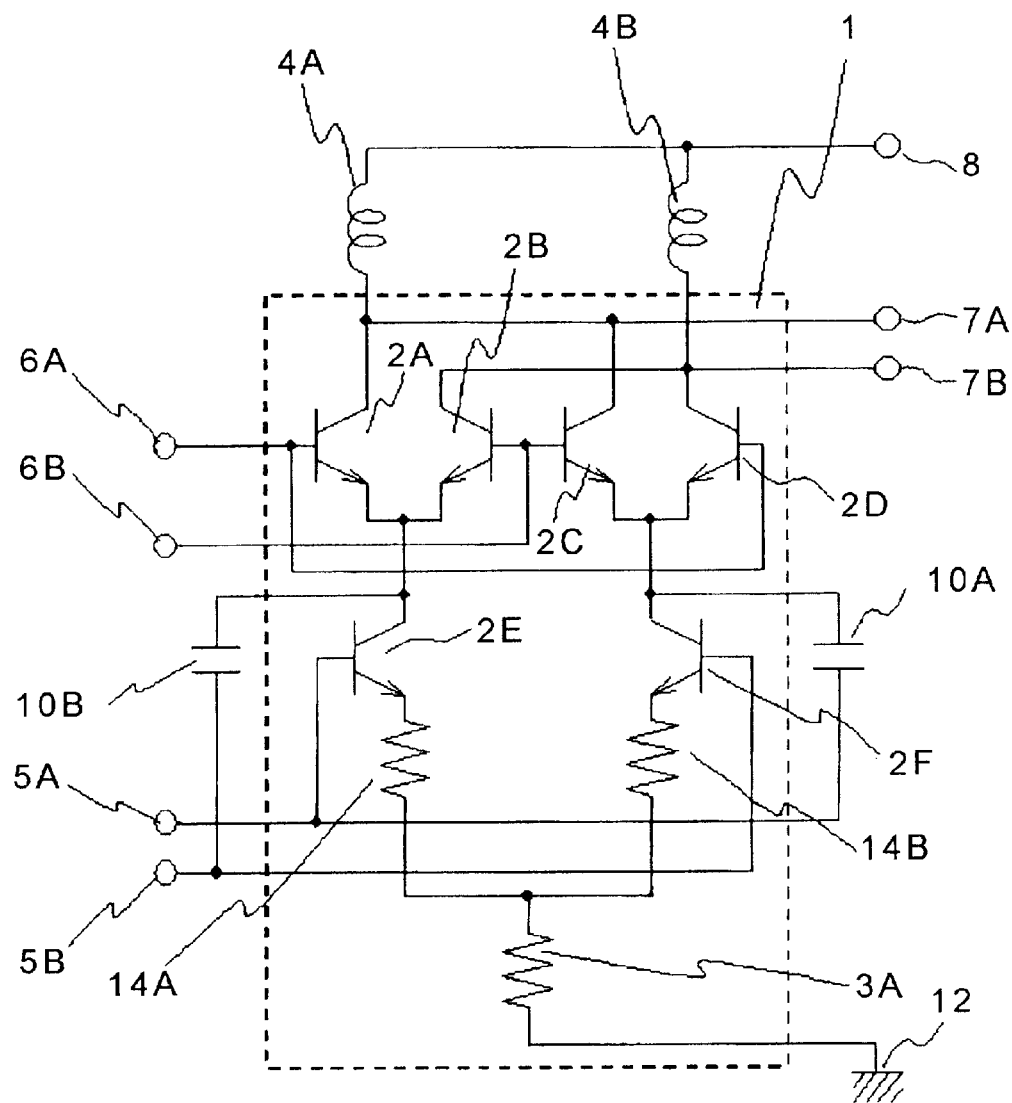
FIG. 11 is a circuit diagram of a mixer circuit in accordance with the seventh embodiment of the present invention.

FIG. 11 is a circuit diagram of a mixer circuit in accordance with the seventh embodiment.

The illustrated mixer circuit in accordance with the seventh embodiment is structurally different from the mixer circuit in accordance with the first embodiment, illustrated in FIG. 4, only in that first and second capacitors 10A and 10B are used as the first and second impedance elements 9A and 9B, first and second coils 4A and 4B are used as the first and second loads 14A and 14B, a first resistor 14A is arranged between an emitter of the first transistor 2E and the resistor 3A, and a second resistor 14B is arranged between an emitter of the second transistor 2F and the resistor 3A.

In the seventh embodiment, the resistor 3A is designed to have a resistance of 100 ohms, each of the first and second coils 4A and 4B is designed to have an inductance of 100 nH, and each of the first and second resistors 14A and 14B is designed to have a resistance of 10 ohms.

The first to sixth transistors 2E, 2F, 2A, 2D, 2B and 2C are all GaAs heterojunction bipolar transistors (HBT). The third to sixth transistors 2A, 2D, 2B and 2C are designed to have a half size of the first and second transistors 2E and 2F, and to have a constant bias current density.

A total current in the mixer circuit is set at 10 mA.

In the seventh embodiment, when a radio signal frequency of 2 GHz was converted to an intermediate frequency of 100 MHz, the conversion gain was 14 dB, and IIP3 was 7 dBm. These are higher than those of the conventional mixer circuit illustrated in FIG. 2, having the same parameters in parts constituting a mixer circuit, where the conversion gain was 13 dB, and IIP3 was 0 dBm.

In comparison with the first embodiment, though the conversion gain is reduced, IIP3 is increased. Hence, the mixer circuit in accordance with the seventh embodiment can operate with a smaller distortion than a distortion with which the mixer circuit in accordance with the first embodiment operates.

[Eighth Embodiment]

Figure 12:
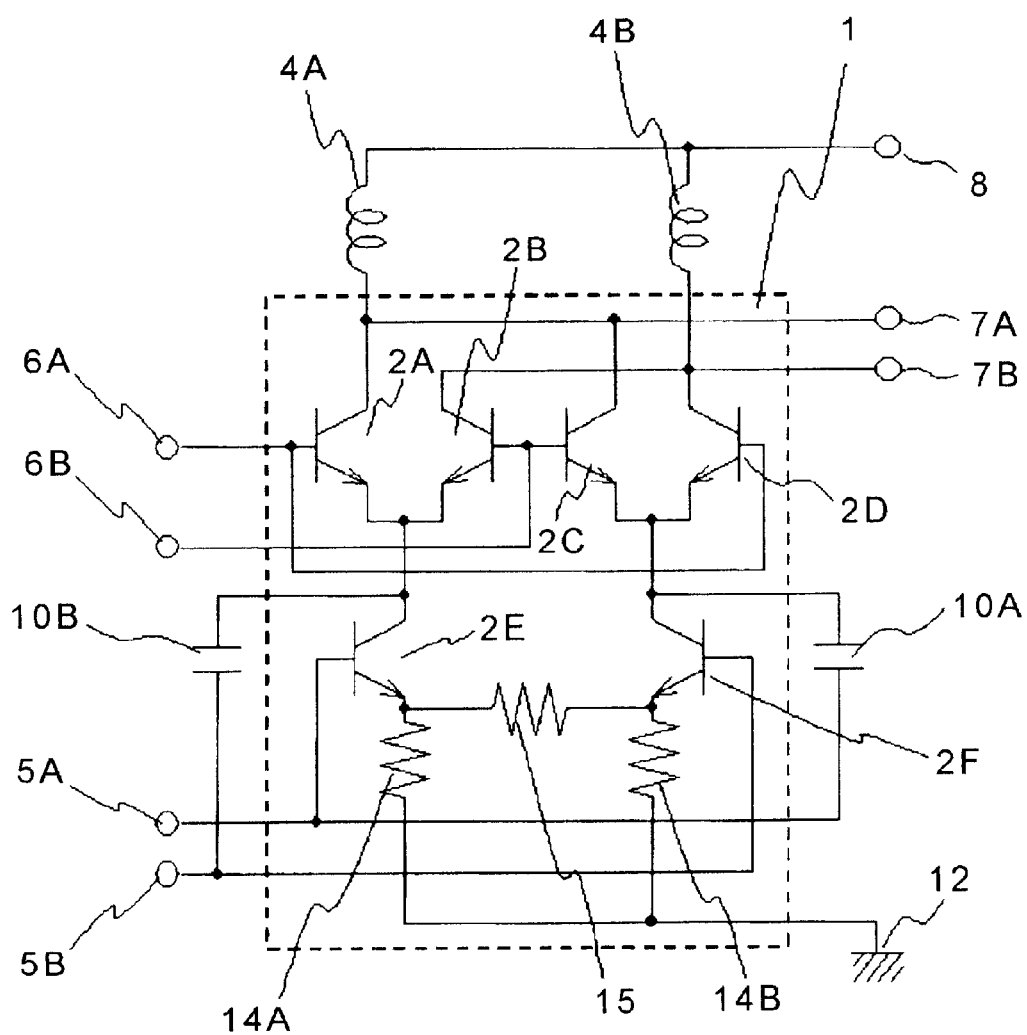
FIG. 12 is a circuit diagram of a mixer circuit in accordance with the eighth embodiment of the present invention.

FIG. 12 is a circuit diagram of a mixer circuit in accordance with the eighth embodiment.

The illustrated mixer circuit in accordance with the eighth embodiment is structurally different from the mixer circuit in accordance with the seventh embodiment, illustrated in FIG. 11, only in that the mixer circuit includes a resistor 15 in place of the resistor 3A.

Specifically, the resistor 15 electrically connects emitters of the first and second transistors 2E and 2F to each other therethrough. Since the resistor 3A is not arranged in the seventh embodiment, emitters of the first and second transistors 2E and 2F are electrically connected to the ground 12 through the first and second resistors 14A and 14B, respectively.

If the resistor 15 is designed to have a resistance of 21 ohms, and the first and second resistors 14A and 14B are designed to have a resistance of 210 ohms, it would be possible to obtain the same advantages as the advantages obtained in the above-mentioned seventh embodiment.

In the above-mentioned first to eighth embodiments, the first to sixth transistors 2E, 2F, 2A, 2D, 2B and 2C are all GaAs HBTs. However, it should be noted that the first to sixth transistors may be Si bipolar transistors, SiGe bipolar transistors, or heterojunction bipolar transistors composed of compound semiconductor other than GaAs and SiGe. As an alternative, the first to sixth transistors may be field effect transistors (FETs).

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-304791 filed on Oct. 27, 1999 including specification, claims, drawings and summary is incorporated herein by reference in its entirety.

What is claimed is:

1. A mixer circuit comprising:
   (a) a first input terminal;
   (b) a second input terminal;
   (c) a third input terminal;
   (d) a fourth input terminal;
   (e) a first transistor having a base electrically connected to said first input terminal;
   (f) a second transistor having a base electrically connected to said second input terminal;
   (g) a third transistor having a base electrically connected to said third input terminal;
   (h) a fourth transistor having a base electrically connected to said third input terminal;
   (i) a fifth transistor having a base electrically connected to said fourth input terminal;
   a sixth transistor having a base electrically connected to said fourth input terminal,
   said first transistor having a collector electrically connected to emitters of said third and fifth transistors,
   said second transistor having a collector electrically connected to emitters of said fourth and sixth transistors,
   said third transistor having a collector electrically connected to a collector of said sixth transistor,
   said fourth transistor having a collector electrically connected to a collector of said fifth transistor;
   (k) a first impedance element connected between said first input terminal and said collector of said second transistor; and
   (l) a second impedance element connected between said second input terminal and said collector of said first transistor.

2. The mixer circuit as set forth in claim 1, wherein said first and second impedance elements have the same electric characteristics.

3. The mixer circuit as set forth in claim 1, wherein each of said first and second impedance elements is comprised of a capacitor.

4. The mixer circuit as set forth in claim 1, wherein each of said first and second impedance elements is comprised of a resistor.

5. The mixer circuit as set forth in claim 1, wherein each of said first and second impedance elements is comprised of a coil, a capacitor and a resistor electrically connected in series to one another.

6. The mixer circuit as set forth in claim 1, wherein each of said first and second impedance elements is comprised of any two of a coil, a capacitor and a resistor, electrically connected in series to each other.

7. The mixer circuit as set forth in claim 1, wherein emitters of said first and second transistors are grounded.

8. The mixer circuit as set forth in claim 1, further comprising a resistor electrically connected at one end to emitters of said first and second transistors and at the other end grounded.

9. The mixer circuit as set forth in claim 1, further comprising a first resistor electrically connected at one end to an emitter of said first transistor and at the other end grounded, and a second resistor electrically connected at one end to an emitter of said second transistor and at the other end grounded.

10. The mixer circuit as set forth in claim 1, further comprising a first resistor electrically connected at one end to an emitter of said first transistor, a second resistor electrically connected at one end to an emitter of said second transistor, and a third resistor electrically connected at one end to the other ends of said first and second resistors and at the other end grounded.

11. The mixer circuit as set forth in claim 1, further comprising a first resistor electrically connected at one end to an emitter of said first transistor and at the other end grounded, a second resistor electrically connected at one end to an emitter of said second transistor and at the other end grounded, and a third resistor electrically connected said emitters of said first and second transistors to each other.

12. The mixer circuit as set forth in claim 1, further comprising a first load electrically connected at one end to a power supply terminal and at the other end to both collectors of said third and sixth transistors and a first output terminal, and a second load electrically connected at one end to a power supply terminal and at the other end to both collectors of said fifth and fourth transistors and a second output terminal.

13. The mixer circuit as set forth in claim 1, further comprising a first coil electrically connected at one end to a power supply terminal and at the other end to both collectors of said third and sixth transistors and a first output terminal, and a second coil electrically connected at one end to a power supply terminal and at the other end to both collectors of said fifth and fourth transistors and a second output terminal.

14. The mixer circuit as set forth in claim 1, wherein each of said first to sixth transistors is comprised of a GaAs heterojunction bipolar transistor.

15. A mixer circuit comprising:
   (a) a first input terminal;
   (b) a second input terminal;
   (c) a third input terminal;
   (d) a fourth input terminal;
   (e) a first transistor having a base electrically connected to said first input terminal;

(f) a second transistor having a base electrically connected to said second input terminal;

(g) a third transistor having a base electrically connected to said third input terminal;

(h) a fourth transistor having a base electrically connected to said third input terminal;

(i) a fifth transistor having a base electrically connected to said fourth input terminal;

a sixth transistor having a base electrically connected to said fourth input terminal, said first transistor having a collector electrically connected to emitters of said third and fifth transistors, said second transistor having a collector electrically connected to emitters of said fourth and sixth transistors, said third transistor having a collector electrically connected to a collector of said sixth transistor, said fourth transistor having a collector electrically connected to a collector of said fifth transistor;

(k) a first impedance element connected between said first input terminal and said second transistor; and (l) a second impedance element connected between said second input terminal and said first transistor, wherein said third, fourth, fifth and sixth transistors are half in size relative to said first and second transistors, and have a constant bias-current density.

* * * * *